United States Patent
Veinot et al.

(10) Patent No.: US 8,585,797 B2
(45) Date of Patent: Nov. 19, 2013

(54) METHOD FOR PREPARING NANOCRYSTALLINE GERMANIUM IN GEO$_2$ AND FREESTANDING GERMANIUM NANOPARTICLES

(75) Inventors: Jonathan Gordon Conn Veinot, St. Albert (CA); Eric James Henderson, Edmonton (CA)

(73) Assignee: The Governors of the University of Alberta, Edmonton (CA)

( * ) Notice: Subject to any disclaimer, the term of this patent is extended or adjusted under 35 U.S.C. 154(b) by 796 days.

(21) Appl. No.: 12/602,896

(22) PCT Filed: Jun. 16, 2008

(86) PCT No.: PCT/CA2008/001126
§ 371 (c)(1),
(2), (4) Date: Apr. 13, 2010

(87) PCT Pub. No.: WO2008/151432
PCT Pub. Date: Dec. 18, 2008

(65) Prior Publication Data
US 2010/0193737 A1    Aug. 5, 2010

Related U.S. Application Data

(60) Provisional application No. 60/944,212, filed on Jun. 15, 2007.

(51) Int. Cl.
| | |
|---|---|
| C22B 41/00 | (2006.01) |
| B01D 11/00 | (2006.01) |
| B01F 1/00 | (2006.01) |
| C01G 17/00 | (2006.01) |
| C01G 19/00 | (2006.01) |
| C01G 21/00 | (2006.01) |
| C22B 13/00 | (2006.01) |
| C22B 25/00 | (2006.01) |

(52) U.S. Cl.
USPC ............................................. 75/689; 423/98

(58) Field of Classification Search
USPC ....... 423/89, 92, 94, 98; 75/689; 252/301.4 F
See application file for complete search history.

(56) References Cited

U.S. PATENT DOCUMENTS

| 4,090,871 A | 5/1978 | Lebleu et al. |
| 2005/0070106 A1 | 3/2005 | Kauzlarich et al. |

FOREIGN PATENT DOCUMENTS

UA   0069866 C2   9/2004

OTHER PUBLICATIONS

Sharp. Stable, freestanding Ge nanocrystals. J. Appl. Phys. 97, 124316 (2005).*
Volodin. Photoluminescence of GeO2 Films containing Germanium Nanocrystals. JETP Letters, vol. 77, No. 8, 2003, pp. 411-414.*
Taraschi et al., "Nanostructure and infrared photoluminescence of nanocrystalline Ge formed by reduction of Si0.75Ge0.25O2/Si0.75Ge0.25 using various H2 pressures", Journal of Applied Physics, Jun. 15, 2003, pp. 9988-9996, vol. 93, No. 12.
Siddiqui et al., "Surface Preparation of Germanium using Reactive Gas Phases" (Abstract), The 19th Rocky Mountain Regional Meeting, Oct. 16, 2006, [online] <http://acs.confex.com/acs/rmrm06/techprogram/P33753.HTM>.
Henderson et al., "Tailoring the Optical Properties of Group IV Semiconductor Nanocrystals" Nanoform Canada Jun. 18, 2007.
Warner, J.H., Tilley, R.D., "Synthesis of Water-Soluble Photoluminescent Germanium Nanocrystals", Nanotechnology, 17, 2006, 3745.
Wu, H.P., Ge, M.Y., Yao, C.W., Wang, Y.W., Zeng, Y.W., Wang, L.N., Zhang, G.Q., Jiang, J.Z., "Blue Emission of Ge Nanocrystals Prepared by Thermal Decomposition", Nanotechnology, 17, 2006, 5339.
Lu, X, Korgel, B.A., Johnston, K.P., "Synthesis of Germanium Nanocrystals in High Temperature Supercritical CO2", Nanotechnology, 16, 2005, S389.
Lu, X, Korgel, B.A., Johnston, K.P., "High Yield of Germanium Nanocrystals Synthesized From Germanium Diiodide in Solution", Chem. Mater., 17, 2005, 6479.
Yang, H., Yang, R., Wan, X., Wan, W., "Structure and Photoluminescence of Ge Nanoparticles with Different Sizes Embedded in SiO2 Glasses Fabricated by a Sol-Gel Method", J. Crys. Growth, 261, 2004, 549.
Wilcoxon, J.P., Provencio, P.P., Samara, G.A., "Synthesis and Optical Properties of Colloidal Germanium Nanocrystals", Phys. Rev. B, 64, 2001, 035417-1.
Taylor, B.R., Kauzlarich, S.M., "Solution Synthesis and Characterization of Quantum Confined Ge Nanoparticles", Chem. Mater., 11, 1999, 2493.
International Search Report for PCT/CA2008/001126.
International Preliminary Examination Report for PCT/CA2008/001126.

* cited by examiner

*Primary Examiner* — Carol M Koslow
*Assistant Examiner* — Matthew E Hoban
(74) *Attorney, Agent, or Firm* — Bereskin & Parr LLP/S.E.N.C.R.L., s.r.l.; Patricia Folkins

(57) ABSTRACT

Methods for preparing nc-Ge/GeO$_2$ composites by under reductive thermal processing conditions are described. Also described are methods of preparing freestanding nc-Ge via release from the nc-Ge/GeO$_2$ composites.

18 Claims, 7 Drawing Sheets

A.

B.

A.

B.

A.

B.

A.

B.

A.

B.

METHOD FOR PREPARING NANOCRYSTALLINE GERMANIUM IN GEO₂ AND FREESTANDING GERMANIUM NANOPARTICLES

This application is a National Stage of International Application No. PCT/CA2008/001126, filed Jun. 16, 2008, which claims the benefit of Provisional Application No. 60/944,212, filed Jun. 15, 2007, the contents of both of which are herein incorporated by reference.

FIELD OF THE DISCLOSURE

The present disclosure relates to methods of preparing nanocrystalline germanium (nc-Ge) embedded in $GeO_2$, in particular from a germanium-rich oxide precursor via reductive thermal processing. Further the present disclosure relates to the release of freestanding nc-Ge from the nc-Ge/$GeO_2$ composites.

BACKGROUND OF THE DISCLOSURE

Following the discovery of visible photoluminescence (PL) from porous silicon,[1] Group IV semiconductor nanocrystals have become the focus of intense research due to their unique chemical and optical characteristics. The emergence of size dependent properties in nanoscale silicon and germanium has not only challenged semiconductor band structure models but also expanded the potential applications of these materials. Silicon and germanium nanocrystals (nc-Si, nc-Ge) both display size-dependent PL[2,3] resulting from quantum confinement effects and have been investigated for potential integration into a variety of optoelectronic devices.[4,5]

Germanium nanocrystals have been produced by ion implantation, laser ablation, anodization of bulk germanium, sputtering and solution based reduction.[6-12]

SUMMARY OF THE DISCLOSURE

Herein, the first application of germanium-rich oxides as precursors to nanocrystalline-Ge/$GeO_2$ (nc-Ge/$GeO_2$) composites via straightforward reductive thermal processing is reported. Further photoluminescent, freestanding germanium nanocrystals were readily liberated from the nc-Ge/$GeO_2$ composites upon treatment with hot water.

Accordingly, the present disclosure relates to a method for preparing a nc-Ge/$GeO_2$ composites comprising treating a germanium-rich oxide under reductive thermal conditions.

In an embodiment of the disclosure, the germanium-rich oxide is selected from $GeO_2$ and $RGeO_{1.5}$, wherein R is selected from hydrogen, $C_{6-14}$aryl, $C_{1-20}$alkyl and $C_{3-20}$cycloalkyl.

In a further embodiment of the disclosure, $RGeO_{1.5}$ is obtained by the hydrolysis and condensation of $RGeX_3$, wherein R is as defined above and X is any hydrolysable group.

The disclosure also includes a method for preparing photoluminescent nc-Ge comprising contacting the nc-Ge/$GeO_2$ composites prepared using the method described above with water under conditions effective to produce photoluminescent nc-Ge. In a further embodiment of the invention, the nc-Ge are treated with acid to provide hydride surface terminated nc-Ge.

The disclosure also includes nc-Ge/$GeO_2$ composites and freestanding nc-Ge prepared using the methods of the present disclosure as well as the use of such materials in, for example, microelectronic, optoelectronic, photovoltaic and optical sensor devices. The composites and nc-Ge may be produced in any form including, for example, films and powders.

The methods of the present disclosure do not involve costly procedures, highly specialized reagents, or elaborate clean-up procedures. The precursor oxide polymers are air and light stable and the nanocrystals are liberated from the oxide matrix simply by heating in water. Furthermore, the size-dependence on thermal processing conditions can easily accommodate size tunability.

Other features and advantages of the present disclosure will become apparent from the following detailed description. It should be understood, however, that the detailed description and the specific examples while indicating preferred embodiments of the disclosure are given by way of illustration only, since various changes and modifications within the spirit and scope of the disclosure will become apparent to those skilled in the art from this detailed description.

BRIEF DESCRIPTION OF THE DRAWINGS

The disclosure will now be described in relation to the drawings in which.

DETAILED DESCRIPTION OF THE DISCLOSURE

Figure 1:
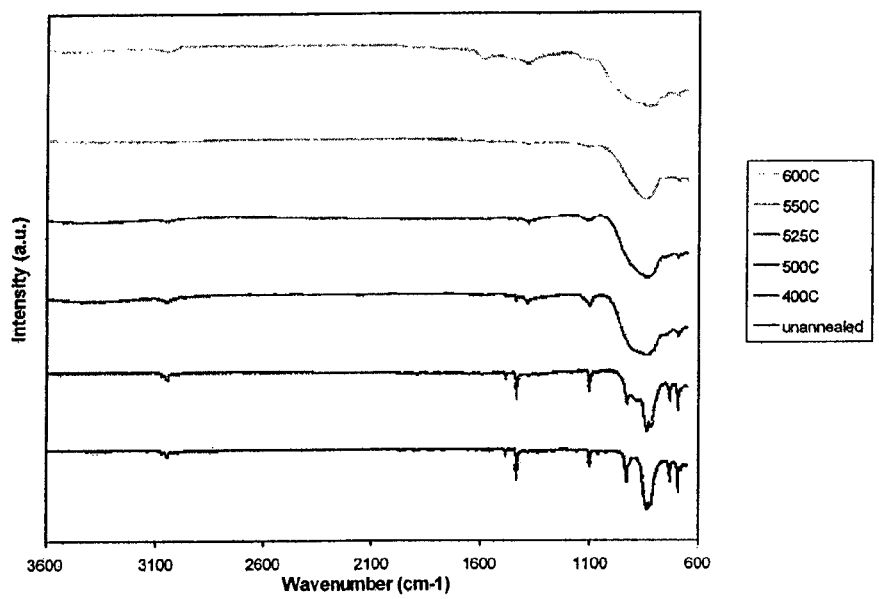
FIG. 1A shows FTIR spectra of samples processed at different peak temperatures for 1 hr in slightly reducing atmosphere.
FIG. 1B shows FTIR spectra of samples processed for various times at 525° C. in slightly reducing atmosphere.
Figure 1:
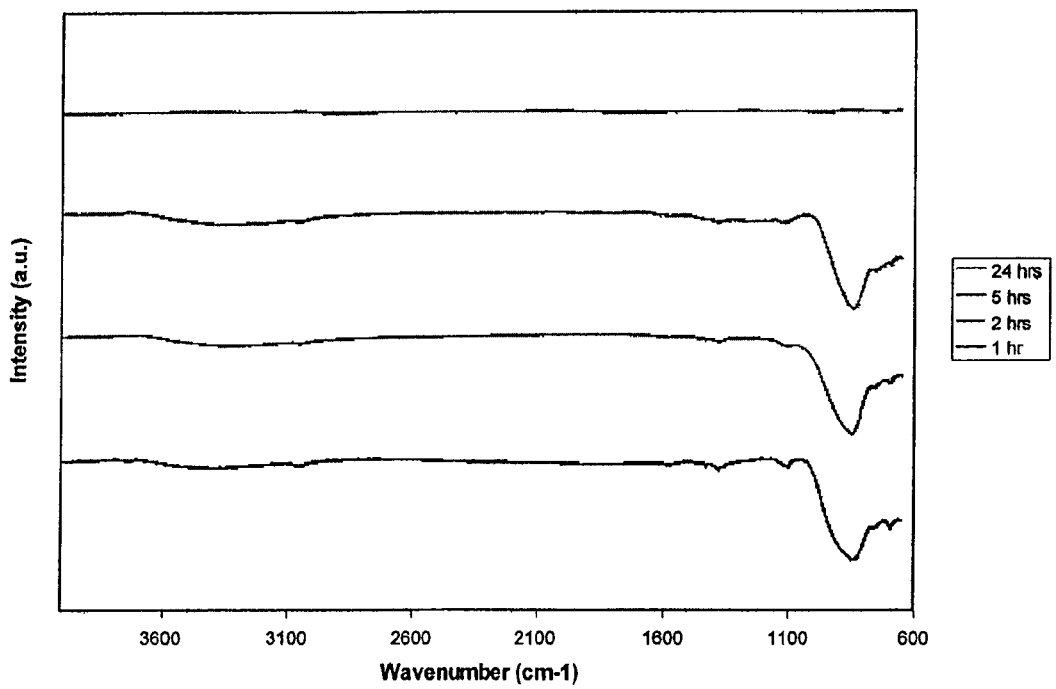

It has been shown that germanium rich oxides (GRO) undergo thermal disproportionation in a reducing atmosphere to yield stoichiometric germanium oxide ($GeO_2$) and elemental Ge. It was shown that this elemental Ge could nucleate and grow to yield germanium nanocrystals (nc-Ge) embedded in a oxide matrix. In one embodiment of the disclosure phenyl trichlorogermane ($C_6H_5GeCl_3$) was used to generate air-stable polymers with a Ge:O ratio of 1:1.5 by subjecting this material to controlled hydrolysis and condensation. The synthetic scheme of this embodiment of the present disclosure is presented in Scheme 1.

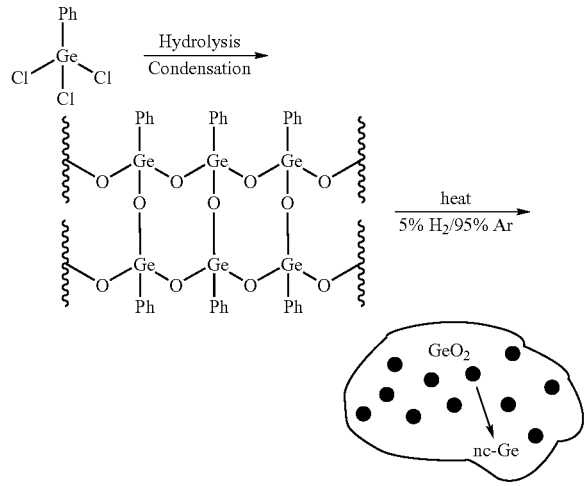

It has further been found that non-crystalline $GeO_2$ could yield elemental Ge that could contribute to nanocrystal growth, through reduction of Ge(IV) to Ge(0) in reductive thermal conditions.

Factors such as thermal processing peak temperature and processing time influence nanocrystal size. It was also found that nc-Ge generated using the methods of the present disclosure exhibit optical emission. Photoluminescent nc-Ge was liberated from the oxide matrix by simple heating in water.

Accordingly, the present disclosure relates to a method for preparing a nc-Ge/$GeO_2$ composite comprising treating a germanium-rich oxide under reductive thermal conditions.

The term "germanium-rich oxide" refers to any polymeric material comprising germanium (Ge) and oxygen (O), and optionally, other organic moieties. Suitably the polymer is a formed by the hydrolysis and condensation of a suitable precursor germane compound. In embodiments of the disclosure, the germanium-rich oxide comprises Ge and O in a ratio of about 1:1.5 to about 1:2.

In an embodiment of the disclosure, the germanium-rich oxide is selected from $GeO_2$ and $RGeO_{1.5}$, wherein R is selected from hydrogen, $C_{6-14}$aryl, $C_{1-20}$alkyl and $C_{3-20}$cycloalkyl. When the germanium rich oxide is $RGeO_{1.5}$, it is an embodiment of the disclosure that R is selected from hydrogen, $C_{6-10}$aryl, $C_{1-10}$alkyl and $C_{3-10}$cycloalkyl, suitably hydrogen, $C_{5-10}$aryl and $C_{1-6}$alkyl, more suitably phenyl and $C_{1-6}$alkyl, even more suitable, phenyl and methyl, and specifically phenyl.

The term "alkyl" as used herein means straight and/or branched chain, saturated alkyl groups containing from one to 20 carbon atoms and includes methyl, ethyl, propyl, isopropyl, n-butyl, s-butyl, isobutyl, t-butyl, 2,2-dimethylbutyl, n-pentyl, 2-methylpentyl, 3-methylpentyl, 4-methylpentyl, n-hexyl and the like.

The term "aryl" as used herein means a monocyclic or polycyclic aromatic group containing from 6 to 14 carbon atoms and at least one aromatic group and includes phenyl, naphthyl, anthracenyl, 1,2-dihydronaphthyl, 1,2,3,4-tetrahydronaphthyl, fluorenyl, indanyl and indenyl, and the like.

The term "cycloalkyl" as used herein means a monocyclic or polycyclic saturated carbocylic group containing from three to twenty carbon atoms and includes cyclopropyl, cyclobutyl, cyclopentyl, cyclodecyl and the like.

In an embodiment of the present disclosure, $RGeO_{1.5}$ is obtained by the hydrolysis and condensation of a precursor of the Formula $RGeX_3$, wherein R is as defined above and X is any hydrolysable group and each X may be the same or different. Suitably all X groups are the same and are Cl, Br or I, suitably Cl.

Figure 2:
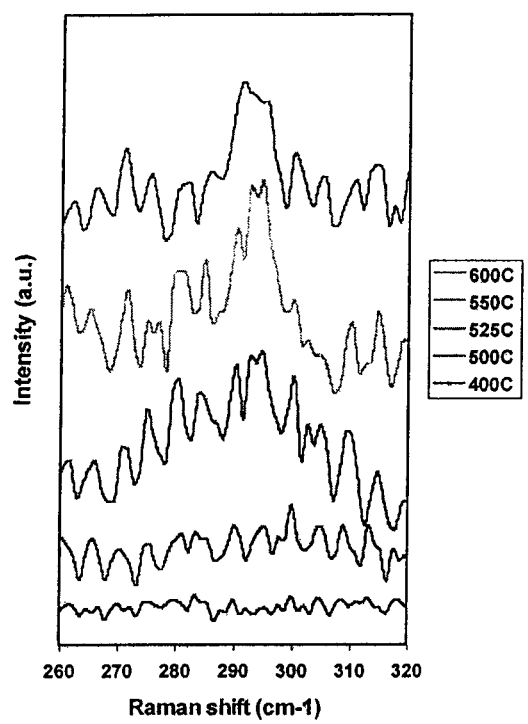
FIG. 2A shows Raman spectra of samples processed at different peak temperatures for 1 hr under slightly reducing atmosphere.
FIG. 2B shows Raman spectra of samples processed for various times at 525° C. in slightly reducing atmosphere.
Figure 2:
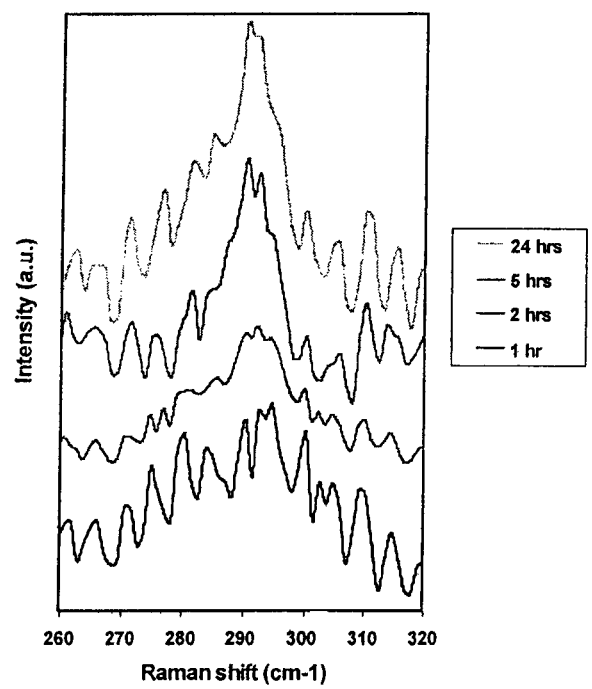
Figure 3:
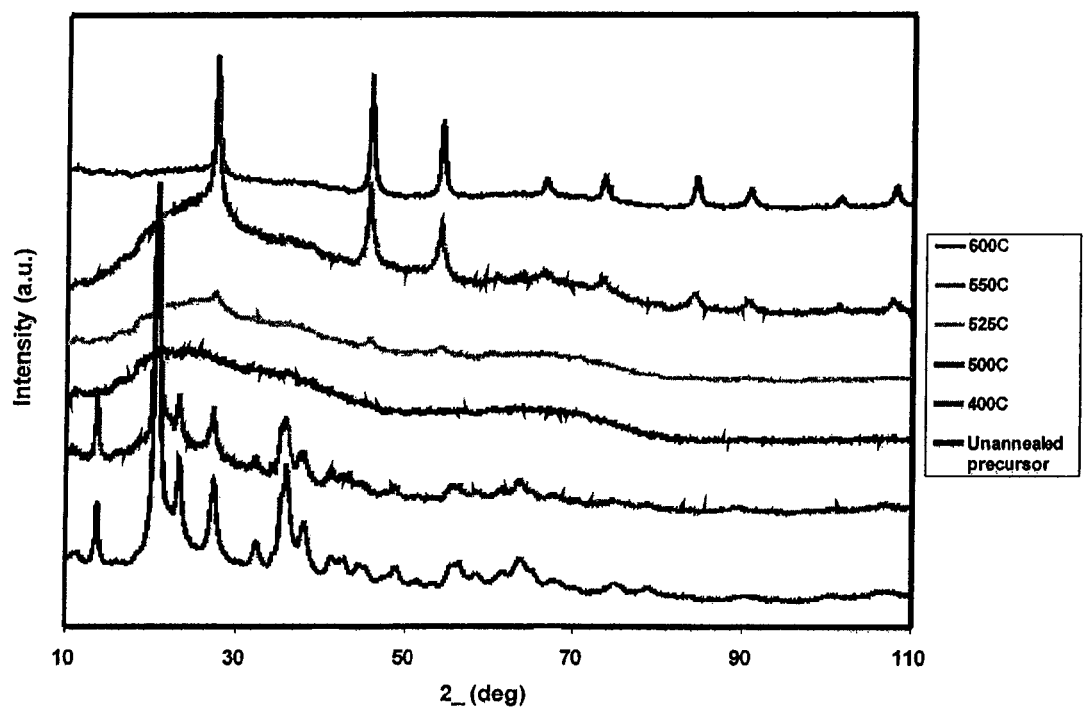
FIG. 3A shows X-ray diffraction patterns showing the growth of nc-Ge as a function of peak processing temperature.
FIG. 3B shows X-ray diffraction patterns showing the growth of nc-Ge as a function of processing time.
Figure 3:
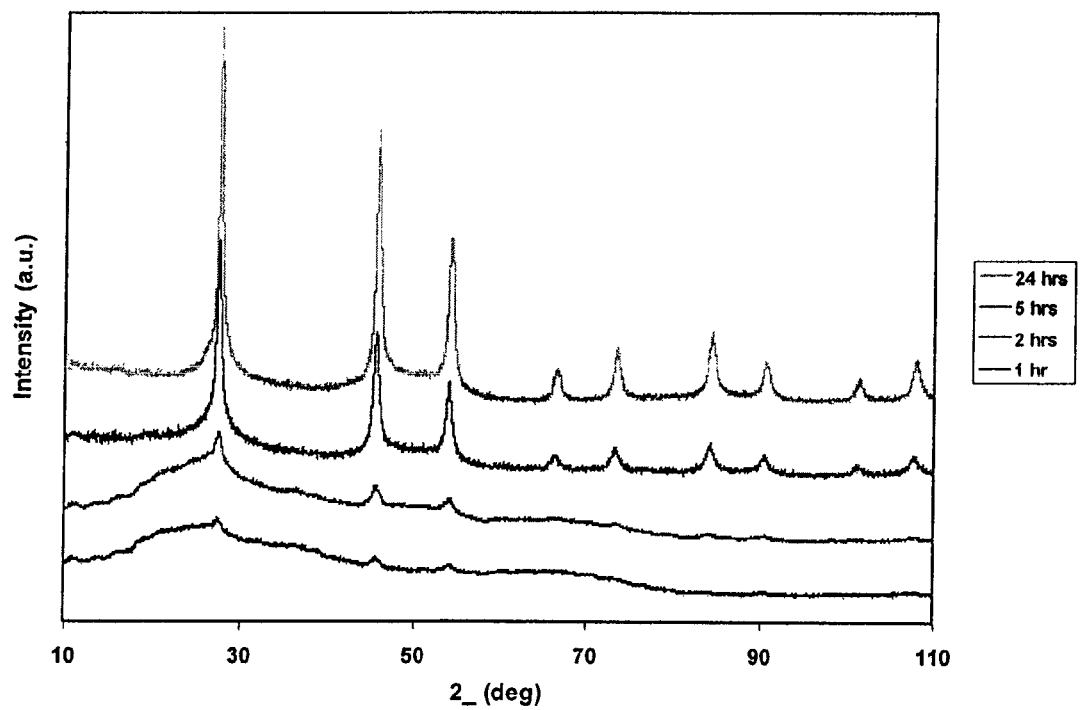

The term "reductive thermal conditions" as used herein means in the presence of a gas comprising hydrogen and suitably an inert gas, such as helium, argon or nitrogen, or a mixture thereof and a time and a temperature sufficient for the production of the nc-Ge/$GeO_2$ composite. In an embodiment of the disclosure, the gas comprises about 2% to about 10% hydrogen and about 90% to about 98% of the inert gas, suitably about 5% hydrogen and about 95% of the inert gas. In an embodiment of the disclosure, the inert gas is argon. In a further embodiment of the disclosure, the time and temperatures sufficient to produce a nc-Ge/$GeO_2$ composite may be determined by a person skilled in the art by varying the processing time and temperature until optimal production of a nc-Ge/$GeO_2$ composite is observed. The observation of nc-Ge/$GeO_2$ may be made using techniques known in the art, such as, for example, Fourier Transform Infrared (FTIR) spectroscopy, Raman spectroscopy, X-ray Photoelectron Spectroscopy (XPS), Transmission Electron Microscopy (TEM), Selected Area Electron Diffraction (SAED), X-ray Diffraction (XRD), Energy Dispersive X-ray Spectroscopy (EDX) and Photoluminescence Spectroscopy (PL). For example, as shown in FIGS. 1A and 1B, the formation of nc-Ge/$GeO_2$, is observed in FTIR by the decrease in intensity, and eventual disappearance of the GeO stretching band at approximately 650 $cm^{-1}$. Further, as shown in FIGS. 2A and 2B, the formation of nc-Ge/$GeO_2$, is observed in Raman Spectroscopy, for example, by the increase in intensity, narrowing and shifting to lower energies of the Ge—Ge optical phonon (OP) vibration centered at approximately 300 $cm^{-1}$. Still further, as shown in FIG. 3, the formation of nc-Ge/$GeO_2$, is observed in X-ray diffraction, for example, by the intensifying and narrowing of the Ge reflections centered at 27°, 47°, and 54°, and the appearance of higher order reflections. The broad feature centered at ca. 20° is characteristic of noncrystalline $GeO_2$.

In an embodiment of the disclosure the reductive thermal conditions comprise heating at temperatures of about 400° C. to about 1000° C., suitably of about 500° C. to about 600° C., for about 30 minutes to about 48 hours, suitably for about 5 hours to about 24 hours.

The disclosure also includes a method for preparing freestanding nc-Ge comprising contacting the nc-Ge/$GeO_2$ composites prepared using the method described above with water under conditions to release the nc-Ge from the $GeO_2$. In embodiment of the disclosure, the conditions to release the nc-Ge from the $GeO_2$ comprise treating the nc-Ge/$GeO_2$ composites with hot water, for example water at about 40° C. to about 75° C., suitably about 55° C., for about 1 hour to about 48 hours, suitably about 24 hours. The nc-Ge may be isolated using any suitable means, including for example centrifugation or filtration. Suitably the resulting material may be further treated under known conditions to affect hydride surface termination, for example by treatment with hydrofluoric acid.

The disclosure also includes nc-Ge/$GeO_2$ composites and freestanding nc-Ge prepared using a method of the present disclosure as well as the use of such materials in, for example, microelectronic, optoelectronic, flash memory, photovoltaic, and optical sensor devices. The composites and freestanding nc-Ge may be produced in any form including, for example, films and powders.

In understanding the scope of the present disclosure, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Finally, terms of degree such as "substantially", "about" and "approximately" as used herein mean a reasonable amount of deviation of the modified term such that the end result is not significantly changed. These terms of degree should be construed as including a deviation of at least ±5% of the modified term if this deviation would not negate the meaning of the word it modifies.

The following non-limiting examples are illustrative of the present disclosure:

EXAMPLES

Reagents and Materials

Phenyl trichlorogermane ($PhGeCl_3$, 98%) was purchased from Aldrich and used without further purification. It was stored in a nitrogen glovebox in subdued light. High-purity water (18.2 MΩ/cm) was obtained from a Barnstead Nanopure Diamond purification system. Isopropyl alcohol (IPA, ≥99.5%) was purchased from Fisher Scientific.

Example 1

Bulk ($PhGeO_{1.5}$) Preparation

In a typical preparation, 16 mL of a 65% (v/v) solution of isopropyl alcohol (IPA) in de-ionized (DI) water was added dropwise to 4.5 mL of $PhGeCl_3$ (7.13 g, 27.8 mmol) under inert atmosphere with vigorous stirring using standard Schlenk line techniques. The clear $PhGeCl_3$ immediately turned white in the regions where the solution was added. Hydrolysis of $PhGeCl_3$ was confirmed by verifying the pH of the mixture (pH=1) which confirmed the liberation of HCl. The cloudy white mixture was lightly heated (ca. 55° C.) and stirred for 24 hrs in order to ensure complete condensation. The solid white precipitate was isolated by vacuum filtration and dried under vacuum. The final product was a white solid (3.7 g) obtained in 80% yield. (Note: This yield represents the recovered product. Slight loss of solid occurred during transference and purification.)

Example 2

Bulk nc-Ge/$GeO_2$ Composite Preparation

The white solid polymer from Example 1 was transferred to a quartz reaction boat in a high-temperature tube furnace. Samples were heated to peak processing temperatures at ca. 20° C./min for various times. The effect of processing atmosphere on nanocrystal growth was investigated by processing identical samples under slightly reducing atmosphere (5% $H_2$, 95% Ar), and completely inert atmosphere (100% Ar). After cooling to room temperature, the solid was mechanically ground in a mortar and pestle. The solids were obtained in yields of approximately 60%. However, the lower mass of the product is to be expected with the liberation of the organic fragments. The various samples investigated are listed in Table 1.

Example 3

Liberation of FS-nc-Ge

The oxide-embedded nc-Ge were liberated from the oxide matrix by treatment in hot water. In a typical liberation procedure, 0.3 g of sample was stirred in 100 mL DI water at ca. 55° C. for 24 hrs. The initial dark black suspension eventually turned light brown as the etching of the $GeO_2$ matrix progressed. Hydride surface termination was accomplished by adding 1 mL hydrofluoric acid (HF). Hydride surface termination is a known reaction platform for the generation of Ge—C bonds via established hydrogermylation reactions.

Example 4

Material Characterization

The materials prepared herein have been extensively characterized in order to fully understand the formation and growth processes of nc-Ge derived from these systems. The characterization techniques include thermogravimetric analysis (TGA), Fourier transform infrared spectroscopy (FTIR), Raman spectroscopy, X-ray diffraction (XRD), X-ray photoelectron spectroscopy (XPS), transmission electron microscopy (TEM), energy dispersive X-ray spectroscopy (EDX), selected-area electron diffraction (SAED), and photoluminescence (PL) spectroscopy. Collectively, this characterization provides insight into nanocrystal size, morphology, surface termination, crystallinity, and optical properties, as well as the factors affecting crystal growth. Ultimately, this enables the efficient tailoring of the nc-Ge optical and electronic properties.

a) Thermogravimetric Analysis (TGA)

Thermogravimetric analysis was performed in order to investigate the percent weight loss as a function of temperature. Thermal treatment under inert atmosphere (Ar) and under slightly reducing atmosphere (5% $H_2$, 95% Ar) resulted in weight losses of ca. 38% and produced dark black glassy solids. This is consistent with the loss of phenyl groups. When coupled to an FTIR spectrometer, the liberation of aromatic carbon-containing fragments was confirmed. TGA also showed that at higher temperatures (>700° C.) some elemental germanium is liberated. When thermally processed under air, the resulting solid was white, indicative of completely oxidized germanium. This underscores the importance of annealing in non-oxidizing atmospheres.

b) Fourier Transform Infrared (FTIR) Spectroscopy

FIG. 1A shows the evolution of the FTIR spectra as a function of thermal processing temperature (1 hr, slightly reducing atmosphere). The spectrum of the unannealed precursor (dark blue trace) shows characteristic phenyl group vibrational modes, such as the aromatic CH stretch at 3100-3000 $cm^{-1}$, aromatic CC stretch at ca. 1500 $cm^{-1}$, in-plane CH bends at ca. 1000 $cm^{-1}$, and out-of-plane CH bends at ca. 675 $cm^{-1}$. The spectrum also displays GeO stretching modes at ca. 850 $cm^{-1}$, consistent with a hydrolyzed/condensed precursor. It is also important to note the absence of a hydroxyl OH stretch at ca. 3200 $cm^{-1}$, confirming complete condensation of the hydrolyzed precursor. As seen in FIG. 1A, the increase in thermal processing temperature is accompanied by a decrease, and eventual loss, in the intensity of the aromatic vibrational peaks, consistent with the loss of phenyl groups. The evolution of the GeO stretch from a well-defined peak to a broad featureless band is consistent with the thermal transformation of a well-defined GeO framework to an ill-defined extended germanium oxide network.

FIG. 1B shows the evolution of the FTIR spectra as a function of thermal processing time (525° C., slightly reducing atmosphere). It can be seen that as processing time increases, the GeO stretching band decreases in intensity and eventually disappears. This is due to the reduction of Ge(IV) (i.e.: $GeO_2$) to Ge(0) by the hydrogen-containing atmosphere (5% $H_2$).

c) Raman Spectroscopy

Raman spectroscopy was performed to evaluate the presence of Ge—Ge bonding through the Ge—Ge optical phonon (OP) vibration, centered at ca. 300 $cm^{-1}$. FIG. 2A shows the evolution of the Raman spectra as a function of thermal processing temperature (1 hr, slightly reducing atmosphere). The absence of an OP peak below temperatures of 500° C. suggests that elemental germanium, Ge(0), is produced at temperatures above 500° C. This provides insight into the onset of the disproportionation reaction. With increased thermal processing temperatures, the Ge—Ge OP peak increases in intensity, narrows, and shifts to lower energies. The increase in intensity is indicative of a greater amount of Ge—Ge bonding, suggestive of nanocrystal growth.

FIG. 2B shows the evolution of the Raman spectra as a function of thermal processing time (525° C., slightly reducing atmosphere). With increased thermal processing time, the Ge—Ge OP peak increases in intensity, narrows, and shifts to slightly lower energies. Again, the increase in intensity is indicative of a greater amount of Ge—Ge bonding, suggestive of nanocrystal growth.

d) X-Ray Diffraction (XRD)

FIG. 3A shows the evolution of the X-ray diffraction pattern that illustrates the formation and growth of nc-Ge as a function of peak processing temperature. These samples were processed for 1 hour at various temperatures under slightly reducing conditions (5% $H_2$, 95% Ar). It is clear that processing at temperatures up to 500° C. gradually reduces the long-range order attributed to the 3D cross-linked polymer, yielding a non-crystalline composite. Further processing at higher temperatures generates crystalline Ge. It is clear that as the peak processing temperature increases, the Ge reflections intensify and narrow, and higher order reflections appear. This is indicative of nanocrystal growth, and illustrates the nanocrystal size-dependence on processing temperature.

FIG. 3B shows the evolution of the X-ray diffraction pattern that illustrates the formation and growth of nc-Ge as a function of processing time. These samples were processed at 525° C. for various times under slightly reducing conditions (5% $H_2$, 95% Ar). It is clear that as the processing time increases, the Ge reflections intensify and narrow, and higher order reflections appear. Again, this is indicative of nanocrystal growth, and illustrates the nanocrystal size-dependence on processing time.

e) X-Ray Photoelectron Spectroscopy (XPS)

Figure 4:
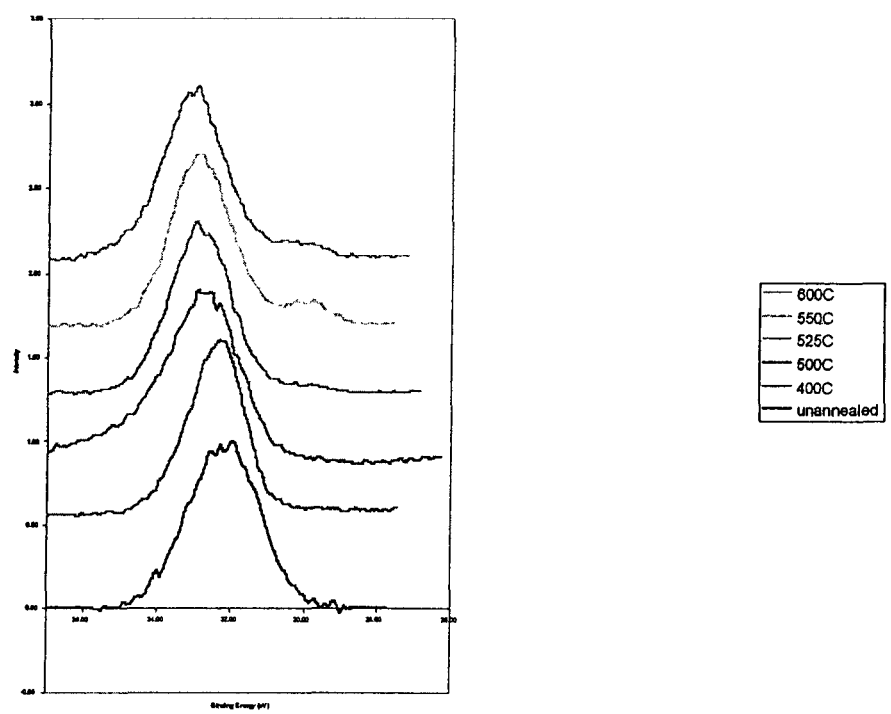
FIG. 4A shows XPS spectra of samples as a function of annealing temperature clearly showing the evolution of the Ge(0) emission at ca. 30 eV.
FIG. 4B shows XPS spectra of samples at 525° C. as a function of processing time clearly showing the evolution of the Ge(0) emission at ca. 30 eV.
Figure 4:
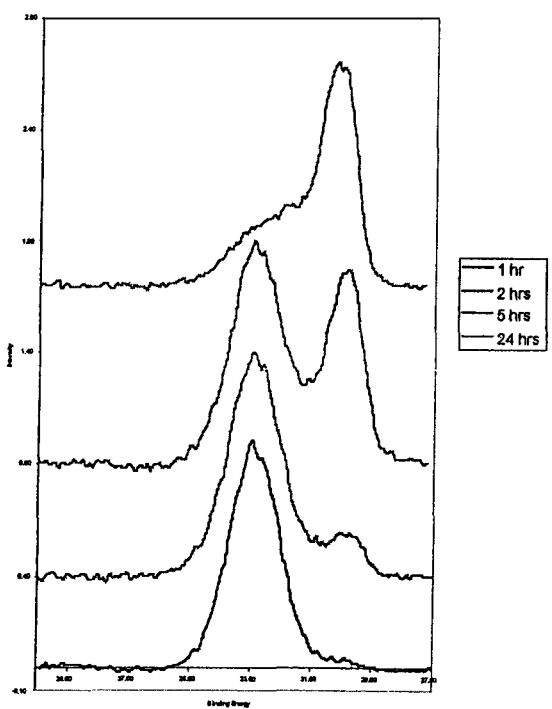

The XP spectra show the generation of Ge(0) at temperatures above 400° C. (FIG. 4A). As expected, the relative amount of Ge(0) increases as a function of processing temperature and time, indicative of nanocrystal growth. It is also interesting to note that during extended heating at 525° C. in a slightly reducing atmosphere (5% $H_2$), Ge(IV) is converted to Ge(0) (FIG. 4B). This suggests that processing atmosphere influences crystal growth, and is another variable that can be used to afford size control.

f) Transmission Electron Microscopy (TEM)

Figure 5:
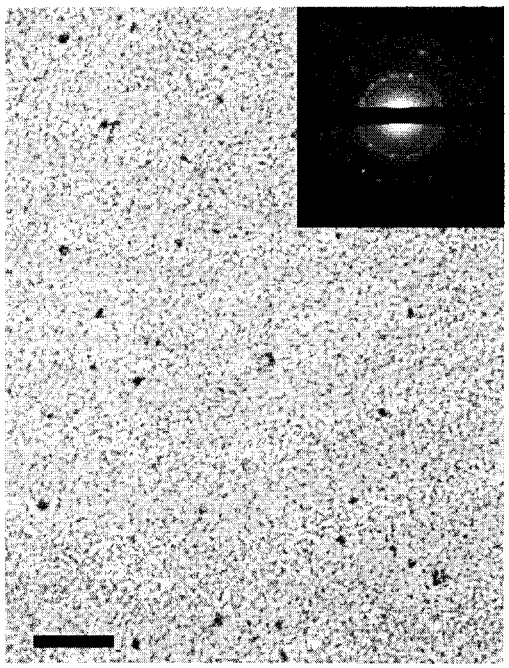
FIG. 5A shows transmission electron micrograph of nc-Ge (scale bar=50 nm). Inset: SAED pattern characteristic of crystalline Ge.
FIG. 5B is a graph showing the size distribution for nc-Ge with mean diameter of 4.5 nm (n=534, σ=0.6 nm).
Figure 5:
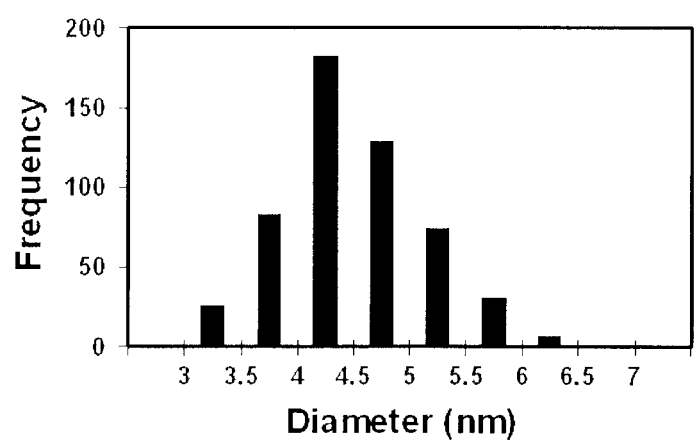

FIG. 5A shows a transmission electron micrograph of liberated nc-Ge. These nanocrystals were isolated from a sample processed at 525° C. for 5 hrs in a slightly reducing atmosphere. It is clear that the nc-Ge adopt a spherical morphology and are extremely monodisperse. The inset of FIG. 5A is a selected-area electron diffraction (SAED) pattern representative of crystalline Ge, and is consistent with the XRD patterns. The nc-Ge have a mean diameter of 4.5 nm (n=534, σ=0.6 nm) and are very monodisperse. The size distribution is presented in FIG. 5B.

g) Energy Dispersive X-Ray Spectroscopy (EDX)

Figure 6:
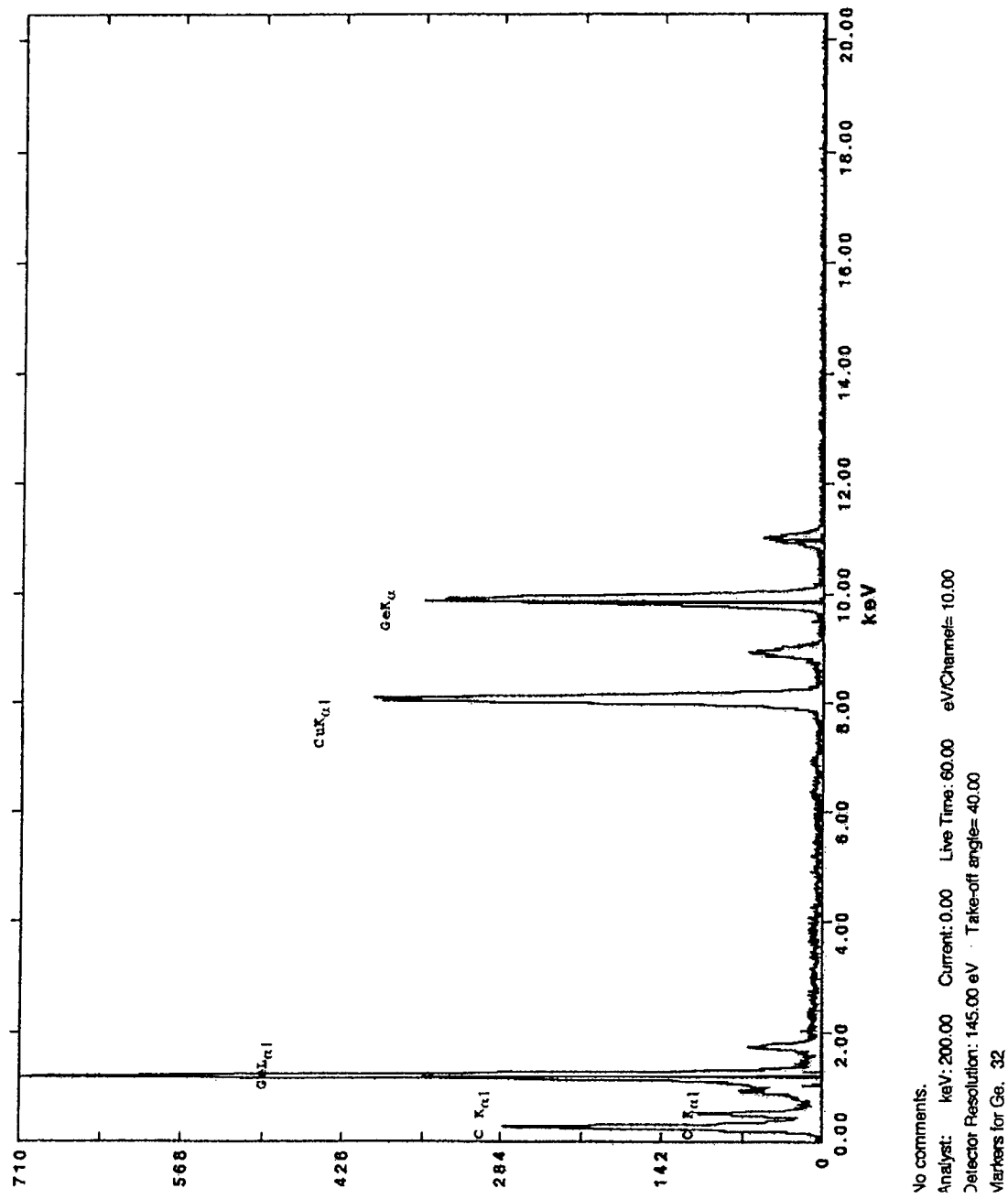
FIG. 6 shows an EDX spectrum for nc-Ge isolated from a sample processed at 535° C. under a slightly reducing atmosphere.

An EDX spectrum was acquired for the nc-Ge isolated from a sample processed at 525° C. for 5 hrs in a slightly reducing atmosphere (FIG. 6) in order to qualitatively verify elemental composition. It is clear that the crystals are composed only of Ge, with a little surface oxide. The presence of Cu and C is due to the TEM sample holder.

h) Photoluminescence (PL) Spectroscopy.

Figure 7:
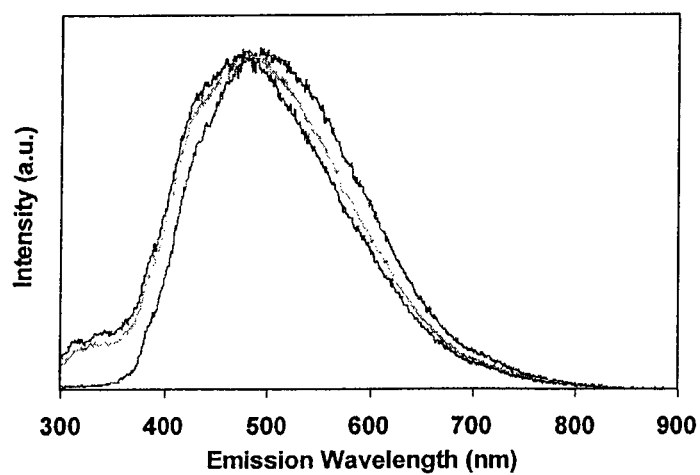
FIG. 7 shows photoluminescence spectra of nc-Ge liberated from the oxide matrix by heating in water. The shift from the right curve to the left curve is associated with increased etching time.

FIG. 7 shows the photoluminescence spectra of liberated nc-Ge. The nanocrystals were liberated from the oxide matrix by simple heating in water. It is clear that they exhibit PL centered at ca. 500 nm that shifts to lower wavelengths as a function of etching time.

While the present disclosure has been described with reference to what are presently considered to be the preferred examples, it is to be understood that the disclosure is not limited to the disclosed examples. To the contrary, the disclosure is intended to cover various modifications and equivalent arrangements included within the spirit and scope of the appended claims.

All publications, patents and patent applications are herein incorporated by reference in their entirety to the same extent as if each individual publication, patent or patent application was specifically and individually indicated to be incorporated by reference in its entirety. Where a term in the present application is found to be defined differently in a document incorporated herein by reference, the definition provided herein is to serve as the definition for the term.

TABLE 1

| Sample | Processing Temp (° C.) | Processing Time (hrs) |
|--------|------------------------|-----------------------|
| 1 | 400 | 1 |
| 2 | 500 | 1 |
| 3 | 525 | 1 |
| 4 | 550 | 1 |
| 5 | 600 | 1 |
| 6 | 525 | 2 |
| 7 | 525 | 5 |
| 8 | 525 | 24 |
| 9 | 500 | 5 |

All samples were processed in slightly reducing atmosphere (5% $H_2$, 95% Ar).

FULL CITATIONS FOR DOCUMENTS REFERRED TO IN THE SPECIFICATION

1. Canham, L. T. *Appl. Phys. Lett.* 1990, 57(10), 1046.
2. Takeoka, S.; Fujii, M.; Hayashi, S.; Yamamoto, K. *Phys. Rev. B* 1998, 58(12), 7921.
3. Veinot, J. G. C. *Chem. Comm.* 2006, 40, 4160.
4. Pavesi, L.; Dal Negro, L.; Mazzoleni, C.; Franzo, G.; Priolo, F. *Nature* 2000, 408, 440.
5. Kuo, Y. H.; Lee, Y. K.; Ge, Y.; Ren, S.; Roth, J. E.; Kamins, T. I.; Miller, D. A. B.; Harris, J. S, *Nature* 2005, 437, 1334.
6. Warner, J. H., Tilley, R. D., "Synthesis of Water-Soluble Photoluminescent Germanium Nanocrystals", *Nanotechnology*, 17, 2006, 3745.

7. Wu, H. P., Ge, M. Y., Yao, C. W., Wang, Y. W., Zeng, Y. W., Wang, L. N., Zhang, G. Q., Jiang, J. Z., "Blue Emission of Ge Nanocrystals Prepared by Thermal Decomposition", *Nanotechnology*, 17, 2006, 5339.

8. Lu, X., Korgel, B. A., Johnston, K. P., "Synthesis of Germanium Nanocrystals in High Temperature Supercritical $CO_2$", *Nanotechnology*, 16, 2005, S389.

9. Lu, X., Korgel, B. A., Johnston, K. P., "High Yield of Germanium Nanocrystals Synthesized From Germanium Diiodide in Solution", *Chem. Mater.*, 17, 2005, 6479.

10. Yang, H., Yang, R., Wan, X., Wan, W., "Structure and Photoluminescence of Ge Nanoparticles with Different Sizes Embedded in $SiO_2$ Glasses Fabricated by a Sol-Gel Method", *J. Crys. Growth*, 261, 2004, 549.

11. Wilcoxon, J. P., Provencio, P. P., Samara, G. A., "Synthesis and Optical Properties of Colloidal Germanium Nanocrystals", *Phys. Rev. B*, 64, 2001, 035417-1.

12. Taylor, B. R., Kauzlarich, S. M., "Solution Synthesis and Characterization of Quantum Confined Ge Nanoparticles", *Chem. Mater.*, 11, 1999, 2493.

We claim:

1. A method for preparing nc-Ge/$GeO_2$ composites comprising treating a germanium-rich oxide of the formula $RGeO_{1.5}$, wherein R is selected from hydrogen, $C_{6-14}$aryl, $C_{1-20}$alkyl and $C_{3-20}$cycloalkyl, under reductive thermal conditions.

2. The method according to claim 1, wherein R is selected from hydrogen, $C_{6-10}$aryl, $C_{1-10}$alkyl and $C_{3-10}$-cycloalkyl.

3. The method according to claim 2, wherein R is selected from phenyl and $C_{1-6}$alkyl.

4. The method according to claim 1, wherein R is selected from hydrogen, $C_{6-10}$aryl and $C_{1-6}$alkyl.

5. The method according to claim 3, wherein R is selected from phenyl and methyl.

6. The method according to claim 5, wherein R is phenyl.

7. The method according to claim 1, wherein the reductive thermal conditions comprise heating in the presence of a gas comprising hydrogen and an inert gas, at temperatures of about 400° C. to about 1000° C., for about 30 minutes to about 48 hours.

8. The method according to claim 7, wherein the inert gas is selected from helium, argon, nitrogen and mixtures thereof.

9. The method according to claim 8, wherein the inert gas is argon.

10. The method according to claim 7, wherein the gas comprises about 2 mol % to about 10 mol % hydrogen and about 90 mol % to about 98 mol % of the inert gas.

11. The method according to claim 10, wherein the gas comprises about 5 mol % hydrogen and about 95 mol % of the inert gas.

12. The method according to claim 1, wherein $RGeO_{1.5}$ is obtained by hydrolyzing and condensing a precursor of the formula $RGeX_3$, wherein X is any hydrolysable group and each X may be the same or different.

13. The method according to claim 12, wherein all X groups are the same and are Cl, Br or I.

14. The method according to claim 13, wherein X is Cl.

15. A method for preparing freestanding nc-Ge comprising:

(a) treating a germanium-rich oxide of the formula $RGeO_{1.5}$, wherein R is selected from hydrogen, $C_{6-14}$aryl, $C_{1-20}$alkyl and $C_{3-20}$cycloalkyl, under reductive thermal conditions to provide nc-Ge/$GeO_2$ composites; and (b) contacting the nc-Ge/$GeO_2$ composites with water under conditions to release the nc-Ge from the $GeO_2$.

16. The method according to claim 15, wherein the conditions to release the nc-Ge from the $GeO_2$ comprise treating the nc-Ge/$GeO_2$ composites with water at about 40° C. to about 75° C., for about 1 hour to about 48 hours.

17. The method according to claim 15, wherein the nc-Ge are further treated under conditions to affect hydride surface termination.

18. The method according to claim 17, wherein the conditions to affect hydride surface termination comprise treatment with hydrofluoric acid.

\* \* \* \* \*

UNITED STATES PATENT AND TRADEMARK OFFICE
CERTIFICATE OF CORRECTION

PATENT NO. : 8,585,797 B2  
APPLICATION NO. : 12/602896  
DATED : November 19, 2013  
INVENTOR(S) : Jonathan Gordon Conn Veinot et al.

Page 1 of 1

It is certified that error appears in the above-identified patent and that said Letters Patent is hereby corrected as shown below:

In the Claims
In claim 1 at column 9, line 22, "nc" should read "*nc*" in italics.
In claim 2 at column 9, line 28, "-cycloalkyl" should read "cycloalkyl".
In claim 7 at column 9, line 39, "C." should read "C".
In claim 7 at column 9, line 39, "C." should read "C".
In claim 15 at column 10, line 19, "nc" should read "*nc*" in italics.
In claim 15 at column 10, line 24, "nc" should read "*nc*" in italics.
In claim 15 at column 10, line 27, "nc" should read "*nc*" in italics.
In claim 16 at column 10, lines 29 and 30, "nc" should read "*nc*" in italics.

Signed and Sealed this
Eleventh Day of March, 2014

Michelle K. Lee
*Deputy Director of the United States Patent and Trademark Office*